(12) United States Patent
Heuer et al.

(10) Patent No.: US 10,626,490 B2
(45) Date of Patent: Apr. 21, 2020

(54) PROCESS AND APPARATUS FOR THERMOCHEMICALLY HARDENING WORKPIECES

(71) Applicant: ALD VACUUM TECHNOLOGIES GMBH, Hanau (DE)

(72) Inventors: Volker Heuer, Frankfurt (DE); Klaus Löser, Mainhausen (DE)

(73) Assignee: ALD Vacuum Technologies GmbH, Hanau (DE)

(*) Notice: Subject to any disclaimer, the term of this patent is extended or adjusted under 35 U.S.C. 154(b) by 624 days.

(21) Appl. No.: 14/783,969

(22) PCT Filed: Apr. 15, 2014

(86) PCT No.: PCT/EP2014/001017
§ 371 (c)(1),
(2) Date: Oct. 12, 2015

(87) PCT Pub. No.: WO2014/170022
PCT Pub. Date: Oct. 23, 2014

(65) Prior Publication Data
US 2016/0053359 A1    Feb. 25, 2016

(30) Foreign Application Priority Data

Apr. 17, 2013 (DE) .................. 10 2013 006 589

(51) Int. Cl.
*C23C 8/30* (2006.01)
*C23C 8/36* (2006.01)
(Continued)

(52) U.S. Cl.
CPC .............. *C23C 8/30* (2013.01); *C21D 1/06* (2013.01); *C21D 9/0062* (2013.01); *C23C 8/34* (2013.01);
(Continued)

(58) Field of Classification Search
CPC .... C23C 8/30; C23C 8/06; C23C 8/20; C23C 8/22; C23C 8/24; C23C 8/26; C23C 8/28;
(Continued)

(56) References Cited

U.S. PATENT DOCUMENTS 4,900,371 A * 2/1990 Dexter ...................... C23C 8/36
148/222
5,558,725 A * 9/1996 Schnatbaum ............. C23C 8/38
148/222
(Continued)

FOREIGN PATENT DOCUMENTS

DE          101 18 244 C1    8/2002
EP          0 735 149 A1     10/1996
EP          1 247 875 A2     10/2002

OTHER PUBLICATIONS

Nishimoto, A. et al, "Effect of Through Cage on Active Screen Plasma Nitriding Properties," Materials Transactions, vol. 50, No. 5, Apr. 2, 2009, pp. 1169-1173, The Japan Institute of Metals and Materials, Sendai [JP].

*Primary Examiner* — Alexandra M Moore
(74) *Attorney, Agent, or Firm* — ProPat, LLC; Cathy R. Moore (57) ABSTRACT

A process and apparatus for thermochemically hardening workpieces is provided incorporating the following steps, carried out in a variable sequence: one or more carburizing steps, each in a carbon-containing gas atmosphere at a pressure of less than 50 mbar, the workpieces being held at temperatures of 900 to 1050° C.; if appropriate, one or more diffusion steps, each in a gas atmosphere at a pressure of less than 100 mbar; and one or more nitriding steps, each in a nitrogen-containing discharge plasma at a pressure of less than 50 mbar, the workpieces being held at temperatures of 800 to 1050° C.

39 Claims, 6 Drawing Sheets

(51) Int. Cl.
*C23C 8/34* (2006.01)
*C21D 9/00* (2006.01)
*C21D 1/06* (2006.01)
*H01J 37/32* (2006.01)

(52) U.S. Cl.
CPC ............ C23C 8/36 (2013.01); H01J 37/3244 (2013.01); H01J 37/32458 (2013.01); H01J 37/32899 (2013.01); *H01J 2237/332* (2013.01)

(58) Field of Classification Search
CPC .... C23C 8/32; C23C 8/34; C23C 8/36; C23C 8/38; C21D 9/0062; C21D 1/06; C21D 9/00; H01J 37/3244; H01J 37/32458; H01J 37/32899; H01J 2237/332
See application file for complete search history.

(56) References Cited

U.S. PATENT DOCUMENTS

| | | | | |
|---|---|---|---|---|
| 5,859,404 | A * | 1/1999 | Wei | C23C 8/36 148/239 |
| 5,989,363 | A * | 11/1999 | Georges | C23C 8/36 148/222 |
| 6,235,128 | B1 | 5/2001 | Chang et al. | |
| 7,465,362 | B2 * | 12/2008 | Kumar | B82Y 30/00 148/222 |
| 2002/0166607 | A1 * | 11/2002 | Altena | C23C 8/34 148/218 |
| 2005/0241736 | A1 * | 11/2005 | Bell | A61F 2/30767 148/565 |
| 2006/0048857 | A1 * | 3/2006 | Cooper | C23C 8/06 148/220 |
| 2012/0118435 | A1 * | 5/2012 | Zurecki | C23C 8/24 148/232 |

* cited by examiner

PROCESS AND APPARATUS FOR THERMOCHEMICALLY HARDENING WORKPIECES

CROSS-REFERENCE TO RELATED APPLICATIONS

This application is being filed under 35 U.S.C. § 371 as a National Stage Application of pending International Application No. PCT/EP2014/001017 filed Apr. 15, 2014, which claims priority to the following parent application: German Patent Application No. 10 2013 006 589.5, filed Apr. 17, 2013. Both International Application No. PCT/EP2014/001017 and German Patent Application No. 10 2013 006 589.5 are hereby incorporated by reference herein in their entirety.

FIELD OF THE INVENTION

The present invention relates to a process and an apparatus for the thermochemical hardening of workpieces, comprising, in a variable order:
- one or more carburization steps, in each case in a carbon-containing gas atmosphere having a pressure of less than 50 mbar, where the workpieces are maintained at temperatures of from 900 to 1050° C.;
- optionally one or more diffusion steps, in each case in a gas atmosphere having a pressure of less than 100 mbar; and
- one or more nitriding steps, in each case in a nitrogen-containing gas atmosphere having a pressure of less than 50 mbar, where the workpieces are maintained at temperatures of from 800 to 1050° C.

SUMMARY OF ADVANTAGEOUS EMBODIMENTS OF THE INVENTION

It is an object of the present invention to provide a process and an apparatus for the thermochemical hardening of workpieces by means of carburization and nitriding, which have the following advantages:
- precise setting of the carbon and nitrogen profiles in the surface zone of the workpieces;
- high productivity and flexible charging; and
- reduced energy consumption and environmental pollution.

This object is achieved by a process comprising, in a variable order:
- ore or more carburization steps, in each case in a carbon-containing gas atmosphere having a pressure of less than 50 mbar, where the workpieces are maintained at temperatures of from 900 to 1050° C.;
- optionally one or more diffusion steps, in each case in a gas atmosphere having a pressure of less than 100 mbar; and
- one or more nitriding steps, in each case in a nitrogen-containing gas atmosphere having a pressure of less than 50 mbar, where the workpieces are maintained at temperatures of from 300 to 1050° C., the nitrogen-containing gas atmosphere contains molecular nitrogen ($N_2$) as donor gas and is excited by means of a discharge plasma; wherein
the process is carried out in such a way that time intervals between two successive process steps are shorter than 15 minutes and the workpieces are maintained in a gas atmosphere having a pressure of less than 300 mbar during these time intervals.

DETAILED DESCRIPTION OF ADVANTAGEOUS EMBODIMENTS OF THE INVENTION

Advantageous embodiments of the process of the invention are characterized in that
- the time intervals between two successive process steps are shorter than 10 minutes, preferably shorter than 5 minutes and in particular shorter than 1 minute;
- the workpieces are maintained in a gas atmosphere having a pressure of less than 200 mbar, preferably less than 100 mbar, in a time interval between two successive process steps;
- the temperature of the workpieces in a time interval between two successive process steps is greater than 600° C., preferably greater than 700° C. and in particular greater than 900° C.;
- the process comprises, in sequential order, the steps carburization/nitriding;
  carburization/diffusion/nitriding,
  nitriding/carburization/nitriding;
  nitriding/carburization/nitriding/carburization; or
  nitriding carburization/diffusion/nitriding;
- the discharge plasma is operated at an optionally pulsed DC voltage of from 200 to 1000 V, a direct current of from 10 to 1200 A and a continuous power of from 2 to 200 kVA;
- the nitrogen-containing gas atmosphere is excited by means of a pulsed direct current discharge plasma, preferably in combination with ignition impulses, in one or more of the nitriding steps;
- the discharge plasma is produced using an active grid electrode in one or more of the nitriding steps;
- the workpieces are maintained at a negative electric potential (bias voltage) relative to the active grid electrode having an absolute value of from 10 to 400 volt, preferably from 10 to 200 V;
- the workpieces are maintained at a negative electric potential (bias voltage) relative to the active grid electrode, where the absolute value of the negative potential on the workpieces is from 2 to 12 times the absolute value of the negative potential of the active grid electrode;
- plasma immersion ion implantation is used in one or more of the nitriding steps;
- the workpieces are maintained at temperatures of from 820 to 1000° C., preferably from 920 to 980° C., during the nitriding steps;

the workpieces are maintained at temperatures of from 940 to 1050° C. during the carburization steps;

the nitrogen-containing gas atmosphere in the nitriding steps consists of $N_2$ and optionally one or more carrier gases such as $H_2$ and argon;

the nitrogen-containing gas atmosphere in the nitriding steps consists of $N_2$ and one or more carbon-containing gases such as $CO_2$ or $CH_4$ and optionally one or more carrier gases such as $H_2$ and argon;

the proportion of the carbon-containing gases in the nitriding steps is, based on $N_2$, from 2 to 20% by volume, preferably from 4 to 15% by volume and in particular from 4 to 10% by volume;

the pressure of the nitrogen-containing gas atmosphere in the nitriding steps is less than 40 mbar, preferably less than 30 mbar and in particular less than 20 mbar;

the carbon-containing gas atmosphere in the carburization steps consists of one or more carbon-containing donor gases such as $C_2H_2$, $CO_2$ and $CH_4$ and optionally one or more carrier gases such as $H_2$ and argon;

the pressure of the carbon-containing gas atmosphere in the carburization steps is less than 40 mbar, preferably less than 30 mbar and in particular less than 20 mbar;

the process comprises a high-pressure diffusion step in an $N_2$ atmosphere having a pressure of from 0.9 to 2 bar; and/or the process comprises, in sequential order, the steps nitriding/carburization/high-pressure diffusion.

Furthermore, it is an object of the present invention to provide an apparatus by means of which the carbon and nitrogen profiles in the surface zone of the workpieces can be set precisely and high productivity and flexible charging can be achieved with reduced energy consumption and without pollution of the environment.

This object is achieved by an apparatus comprising m low-pressure heating chambers, where m=2, 3, 4, 5, 6, 7, 8, 9 or 10;

a gas supply connected to the low-pressure heating chambers which is configured for supplying the low-pressure heating chambers with one or more gases selected from the group consisting of $N_2$, carbon-containing donor gases such as $C_2H_2$, $CO_2$ and $CH_4$ and carrier gases such as $H_2$ and argon;

a transfer chamber to which each of the low-pressure heating chambers and also a lock chamber and a quenching chamber or a bifunctional lock-quenching chamber are connected; or a lock chamber and a quenching chamber which are in each case movable and able to be connected to each of the low-pressure heating chambers; or a bifunctional lock-quenching chamber which is movable and can be connected to each of the low-pressure heating chambers; wherein one or more of the low-pressure heating chambers is/are connected to an electric energy supply and is/are configured for producing a discharge plasma in a nitrogen-containing gas atmosphere comprising $N_2$ as donor gas at temperatures of above 800° C. and pressures of less than 100 mbar.

Advantageous embodiments of the apparatus of the invention are characterized in that the electric energy supply is configured for operation of a discharge plasma at a DC voltage of from 200 to 1000 V, a direct current of from 10 to 200 A and a continuous power of from 2 to 200 kVA;

the electric energy supply is configured for operation using a pulsed DC voltage, preferably in combination with ignition impulses; and/or one or more of the low-pressure heating chambers is/are equipped with an active grid electrode.

The process of the invention preferably comprises in sequential order, the steps:

Charging/evacuation/carburization/nitriding/quenching/discharging;

Charging/evacuation/carburization/diffusion/nitriding/quenching/discharging;

Charging/evacuation/nitriding/carburization/nitriding/quenching/discharging;

Charging/evacuation/nitriding/carburization/nitriding/carburization/quenching/discharging; or Charging/evacuation/nitriding/carburization/diffusion/nitriding/quenching/discharging.

Evacuation is effected in a lock chamber or in a bifunctional lock-quenching chamber. Furthermore, to simplify the wording, the process step of evacuation will be described only in conjunction with a lock chamber. According to the invention, the alternative of evacuation in a bifunctional lock-quenching chamber is always encompassed here.

The workpieces to be treated are placed directly on a preferably plate- or mesh-like charge carrier and/or arranged in a charging rack and the charging rack is optionally placed on the charge carrier. Elongated workpieces such as gearbox shafts are preferably arranged in a suspended manner in the charge carrier or charging rack.

The apparatus of the invention comprises a charge transport system made up of one or more modules, where each module is assigned to a transfer chamber and/or one or more lock chambers, quenching chambers and low-pressure heating chambers. Each module of the charge transport system is equipped with actuators which are connected via electric cables to a central control system of the apparatus, for example a programmable logic controller (PLC).

A preferred embodiment of the apparatus of the invention comprises a stationary bifunctional lock-quenching chamber, m vertically superposed low-pressure heating chambers, where m=2, 3, 4, 5, 6, 7, 8, 9 or 10, and also a transfer chamber, where the bifunctional lock-quenching chamber and the low-pressure heating chambers are connected to the transfer chamber. Each of the low-pressure heating chambers is equipped with a vacuum slide valve or a vacuum door by means of which the interior space of the low-pressure heating chamber can be isolated in a gastight manner from the interior space of the transfer chamber. The bifunctional lock-quenching chamber is equipped with two vacuum slide valves or vacuum doors arranged opposite one another.

In all apparatuses according to the invention, vertically or horizontally movable vacuum slide valves and/or pivotable vacuum doors are used as desired. Vacuum slide valves and vacuum doors are commercially available in a variety of construction types and dimensions.

A further preferred embodiment of the apparatus of the invention comprises a stationary lock chamber, a stationary quenching chamber, m vertically superposed low-pressure heating chambers, where m=2, 3, 4, 5, 6, 7, 8, 9 or 10, and also a transfer chamber, were the lock chamber, the quenching chamber and the low-pressure heating chambers are connected to the transfer chamber. Each of the low-pressure heating chambers is equipped with a vacuum slide valve or a vacuum door by means of which the interior space of the low-pressure heating chamber can be isolated in a gastight manner from the interior space of the transfer chamber. The lock chamber and the quenching chamber are in each case equipped with two vacuum slide valves or vacuum doors arranged opposite one another.

In the two above apparatuses, the charge transport system is arranged essentially in the transfer chamber and comprises an elevator which travels vertically in combination with a telescopic mechanism for accommodating and horizontally moving a charge carrier and/or charging rack with workpieces.

A further preferred embodiment of the apparatus of the invention comprises a stationary lock chamber, a stationary quenching chamber, m low-pressure heating chambers which are arranged horizontally and in a circular manner next to one another, where m=2, 3, 4, 5, 6, 7, 8, 9 or 10, and also a transfer chamber, where the lock chamber, the quenching chamber and the low-pressure heating chambers are connected to the transfer chamber. Each of the low-pressure heating chambers is equipped with a vacuum slide valve or a vacuum door by means of which the interior space of the low-pressure heating chamber can be isolated in a gastight manner from the interior space of the transfer chamber. The lock chamber and the quenching chamber are each equipped with two vacuum slide valves or vacuum doors which are arranged opposite one another. In an apparatus configured in this way, a charge transport system arranged in the transfer chamber comprises a powered rotating plate in combination with a telescopic mechanism for accommodating and horizontally moving a charge carrier and/or charging rack with workpieces.

The low-pressure heating chambers are preferably provided for the thermochemical hardening of workpieces which are arranged in a charge stack having from 1 to 10 horizontal layers, in particular 1, 2, 3, 4 or 5 horizontal layers, where a plurality of workpieces are in each case arranged next to one another distributed over an area and preferably at a distance from one another in a horizontal layer. Accordingly, the low-pressure heating chambers are dimensioned in such a way that the free charging volume has a width and, independently thereof, a length of in each case from 400 to 1000 mm, preferably from 400 to 800 mm, and a height of from 100 to 300 mm, preferably from 100 to 200 mm, at a clear spacing between the charging volume and the interior walls of the low-pressure heating chamber and also the heating elements of from 20 to 40 mm.

At least one of the low-pressure heating chambers is provided for nitriding by means of a discharge plasma and connected to an electric energy supply. To be able to apply a negative potential to a charge carrier with workpieces, the low-pressure heating chamber is preferably equipped with an electric contact having an area. The electric contact is joined to an electric conductor which leads from the contact or from the inside of the low-pressure heating chamber through the wall of the low-pressure heating chamber to the outside and is connected to the electric energy supply.

It is in principle not necessary to apply a negative potential to the workpieces. Rather, the workpieces can be electrically insulated from the interior wall of a low-pressure heating chamber and based on mass potential, or be at a floating potential which is established automatically in the discharge plasma.

Nevertheless, application of a negative potential to the workpieces is provided in the context of the invention. In an advantageous embodiment, the charge carrier comprises a support plate having four positioning feet. The support plate and at least one of the positioning feet are made of an electrically conductive material such as a metal, a metal alloy, graphite, or carbon fiber-reinforced graphite (CFC). The electrically conductive positioning foot is provided for positioning on an electric contact having an area in the low-pressure heating chambers.

An alternative embodiment of the apparatus of the invention comprises a charge transport system having modules which are arranged in lock chambers, quenching chambers, low-pressure heating chambers and optionally in a transfer chamber. A charge carrier configured for such a charge transport system has a first coupling element and optionally rollers in a lower region. The charge transport system or its various modules arranged in lock chambers, quenching chambers, low-pressure heating chambers and optionally in a transfer chamber are equipped with second coupling elements which are configured so as to fit the first coupling element and can be coupled with the latter in a releasable fashion. The modules of the charge transport system are configured in such a way that a charge carrier with workpieces can be transferred from one chamber to an adjacent chamber by means of actuators such as electric linear drives. The second coupling element of the charge transport system of the low-pressure heating chambers intended for nitriding is electrically conductive. For example, the second coupling element consists of a conductive material such as a metal, a metal alloy, graphite or carbon fiber-reinforced graphite (CFC). As an alternative, the second coupling element is equipped with an electric cable and with an electric contact connected to the cable for a charge carrier or for a first coupling element located on a charge carrier. The electric contact is preferably configured as spring, sliding or brush contact.

In an advantageous embodiment of the apparatus of the invention, the low-pressure heating chambers provided for nitriding are equipped with a rotary drive. The rotary drive makes it possible to turn the charge carrier with the workpieces continuously in a discharge plasma during nitriding in order to ensure uniform (averaged over the duration of nitriding) treatment of the workpieces with the discharge plasma. Rotation of the charge carrier with the workpieces has been found to be particularly advantageous when an active grid electrode which extends only along three or two side walls and/or along the top of a low-pressure heating chamber is used for generating the discharge plasma. For loading and unloading of a low-pressure heating chamber for nitriding, it is advantageous to use an active grid electrode having one or optionally two openings opposite one another. As an alternative, a movable or foldable active grid electrode which is positioned or adjusted so as to avoid collision with the charge carrier and the workpieces for loading and unloading of the low-pressure heating chamber is provided in the context of the invention.

In a first loading step, the charge carrier with the workpieces is introduced into a lock chamber or into a bifunctional lock-quenching chamber). The lock chamber is closed so as to be vacuum-tight and evacuated by means of pumps. After the pressure of the gas atmosphere surrounding the workpieces has been reduced to a value of less than 300 mbar, preferably less than 200 mbar and in particular less than 100 mbar, the workpieces are, depending on the respective configuration of the apparatus of the invention, transferred from the lock chamber into a transfer chamber and from the transfer chamber into a low-pressure heating chamber or the lock chamber is positioned in front of a previously evacuated low-pressure heating chamber and coupled in a vacuum tight manner to the low-pressure heating chamber.

To connect a movable lock chamber in a vacuum-tight manner to a low-pressure heating chamber, the lock chamber and optionally the low-pressure heating chamber is/are equipped with coupling elements of a one- or two-piece vacuum coupling. The vacuum coupling advantageously has two flanges with matching sealing faces, were the sealing face of one of the flanges is equipped with an O-ring and one of the flanges has a circumferential protection which shields the sealing faces from radiation and hot residual gas from the low-pressure heating chamber.

As soon as the charge carrier with the workpieces is in a low-pressure heating chamber, the latter is closed in a vacuum-tight manner and evacuated to a pressure of less than 50 mbar, less than 40 mbar, less than 30 mbar, preferably less than 20 mbar. The low-pressure heating chamber is electrically heated and on transfer of the charge carrier with the workpieces has a temperature of greater than 600° C., preferably greater than 700° C. and in particular greater than 800° C. On transfer of the first charge of a production run, the low-pressure heating chamber can also have a temperature of less than 600° C. Depending on the initial temperature on transfer of the charge carrier, the low-pressure heating chamber is supplied for a particular period of time with a fixed amount of electric energy (kWh) in order to set the temperature of the workpieces to from 800 to 1050° C. for nitriding, to from 900 to 1050° C. for carburization or from 800 to 1050° C. for diffusion. Preference is given to each of the low-pressure heating chambers comprising pyrometers, bolometers or thermocouples for measuring the temperature of the workpieces. After the workpieces have attained the desired working temperature and have been maintained at this for a prescribed residence time, one or more process gases such as $N_2$, $C_2H_2$, $CH_4$, $CO_2$, $H_2$, argon are continuously introduced in a controlled manner into the low-pressure heating chamber in order to produce a gas atmosphere suitable for the nitriding, carburization or diffusion. At the same time, the low-pressure heating chamber is continually evacuated by means of one or more vacuum pumps in order to keep the pressure at a prescribed value of less than 50 mbar, less than 40 mbar, less than 30 mbar, preferably less than 20 mbar. The short-term volume flow of the process gas(es) into a low-pressure heating chamber is not more than 1500 l/h (liters per hour), preferably from 150 to 800 l/h. In the nitriding chambers, the maximum volume flow of the process gas is 1000 l/h, preferably from 20 to 600 l/h, from 20 to 400 l/h and in particular from 20 to 300 l/h.

The duration of a nitriding, carburization or diffusion step is in the range from 5 to 150 minutes. If a subsequent nitriding, carburization or diffusion step is provided, this can be carried out in the same low-pressure heating chamber or in a different low-pressure heating chamber. According to the invention, preference is given to carrying out nitriding and carburization steps in different low-pressure heating chambers, so that a particular low-pressure heating chamber is used exclusively for nitriding or exclusively for carburization and optionally for diffusion. Carrying out nitriding and carburization steps in separate low-pressure heating chambers largely avoids problems caused by cross contamination, for example the formation of hydrocyanic acid (HCN). In addition, contamination of the nitriding plasma with carbon can be avoided.

For a subsequent nitriding, carburization or diffusion step in a different low-pressure heating chamber provided for this process step, the charge carrier with the workpieces is transferred back into the transfer chamber or into a movable lock chamber and from this transferred into said low-pressure heating chamber. As an alternative, apparatuses in which two low-pressure heating chambers are arranged next to one another and can be connected to one another via an opening having a vacuum slide valve or a vacuum door are also provided in the context of the invention. In apparatuses having such a configuration, the first low-pressure heating chamber is provided, for example, for carburization and/or diffusion and the second low-pressure heating chamber is provided for diffusion and/or nitriding.

After all nitriding, carburization and diffusion steps have been carried out, the charge carrier with the workpieces is transferred in the above-described manner into a quenching chamber (or bifunctional lock-quenching chamber) and quenched in a known manner, preferably by means of a gas. As an alternative to quenching by means of a gas, quenching by means of oil or a polymer is also provided in the context of the invention.

The apparatus of the invention comprises two, three, four, five, sin, seven, eight, nine or ten electrically heatable low-pressure heating chambers which are each connected via gas lines to separate gas supplies or to a central gas supply. The gas supplies comprise a plurality of containers for process gases selected from the group consisting of $N_2$, carbon-containing donor gases such as $C_2H_2$, $CO_2$ and $CH_4$ and carrier gases such as $H_2$ and argon. Mass flow controllers are arranged in the gas lines so as to make it possible to regulate the amount of gas introduced into the low-pressure heating chambers per unit time. The mass flow controllers are connected via electric cables to a central control system of the apparatus, for example a programmable logic controller (PLC). Each low-pressure heating chamber is equipped with one or more heating elements which preferably consist of graphite or carbon fiber-reinforced graphite (CFC) and are electrically operated. Each low-pressure heating chamber is connected to one or more vacuum pumps or to a central pump facility.

The lock and quenching chambers and also the low-pressure heating chambers and optionally the transfer chamber are advantageously each equipped with pressure sensors which are connected is electric cables to a central control system of the apparatus, for example a programmable logic controller (PLC).

Each of the low-pressure heating chambers has one or two openings and also one or two vacuum slide valves or vacuum doors which are arranged on one end face or two end faces opposite one another of the low-pressure heating chambers.

In an alternative embodiment of the apparatus of the invention, the low-pressure heating chambers are equipped on two opposite end faces with a first and second opening and a first and second vacuum slide valve or a first and second vacuum door. This allows a charge carrier with workpieces to be loaded through a first opening into a low-pressure heating chamber and, after a nitriding, carburization or diffusion step is completed, unloaded through a second opening opposite the first opening. Advantageous embodiments of the apparatus of the invention comprise one or more stationary or movable lock chambers and one or more stationary or movable quenching chambers which are arranged at or are movable at opposite sides of the low-pressure heating chambers. In such an apparatus, a charge carrier with workpieces is moved in only one direction in space, i.e. loaded from a lock chamber through a first opening into a low-pressure heating chamber and, after a nitriding, carburization or diffusion step is complete, passed from the low-pressure heating chamber through a second opening into a quenching chamber. In an apparatus configured in this way with unidirectional material flow, the operations of loading and unloading the low-pressure heating chambers are decoupled from one another and can be optimized virtually independently of one another in respect of the productivity or the throughput of the process of the invention.

The low-pressure heating chambers advantageously comprise an outer and inner chamber wall or walls and also thermal insulation arranged between the outer and inner chamber walls. The outer chamber wall consists of a metallic material, in particular steel sheet, and is optionally equipped with water cooling. The inner chamber wall is made of a heat-resistant material such as graphite or carbon fiber-reinforced graphite (CFC).

The thermal insulation preferably consists of graphite felt. Each low-pressure heating chamber is equipped with one or more heating elements which preferably consist of graphite or carbon fiber-reinforced graphite (CFC) and are electrically operated. The heating elements are preferably arranged in an upper region of the low-pressure heating chamber close to the walls of the inner chamber.

The low-pressure heating chambers are optionally equipped with actuators, for example electrical linear drives, of a modular charge transport system. In order to avoid overheating of the actuators by the radiation in the low-pressure heating chamber, the actuators are arranged within a thermal, preferably water-cooled, shield in a lower region of the low-pressure heating chamber. After loading of a low-pressure heating chamber with a plate-like charge carrier with workpieces, the charge carrier functions as additional shield. In an advantageous embodiment of the apparatus of the invention, the drives of the charge transport system are arranged outside the low-pressure heating chambers and are coupled via shafts and vacuum feed-throughs to mechanical actuators in the low-pressure heating chambers.

At least one of the low-pressure heating chambers is provided for nitriding and connected to an electric energy supply. The electric energy supply comprises a DC voltage source whose plus pole is electrically connected to an electrically conductive interior wall of the low-pressure heating chamber or to an anode arranged within the low-pressure heating chamber. The minus pole of the DC voltage source is preferably electrically connected to an electric contact provided for the charge carrier, to an active grid electrode arranged within the low-pressure heating chamber or to a voltage divider having two clips to which the active grid electrode and the electric contact for the charge carrier are connected in such a way that when the DC voltage source is switched on, the charge carrier and the workpieces acquire a negative potential relative to the active grid electrode.

The electric energy supply is configured for operation using a DC voltage of from 200 to 1000 V, a direct current of from 10 to 200 A and a continuous power of from 2 to 200 kVA. The electric energy supply is preferably configured for generating a pulsed DC voltage having a variably adjustable pulse frequency in the range from a few 100 hertz to 1 megahertz, in particular from 200 hertz to 5 kilohertz, and also a variably adjustable pulse duty factor (pdf) in the range from 1.0 to 0.001. The pulse duty factor (pdf) is the ratio of pulse duration (pd) to the period, i.e. to the sum of pulse duration (pd) and the dead time (dt) during which the DC voltage is switched off, according to the relationship pdf=pd/(pd+dt). The pulse duration (pd) is preferably less than or equal to 100 µs, while the dead time is preferably greater than or equal to 100 µs. In a particularly preferred embodiment, the electric energy supply additionally comprises an ignition impulse generator which at the beginning of a normal pulse generates an ignition impulse having a high peak power of a few megawatts and a short duration of a few microseconds. Such ignition impulses assist the formation of pulsed discharge plasma in a low-pressure heating chamber. Electric energy supplies of the above type are know and are commercially available. Such electric energy supplies typically have a microcontroller-based electronic control system, capacitors and rapid high-power switches, preferably IGBTs (Insulated Gate Bipolar Transistors). In addition, the electric energy supply advantageously comprises a protective circuit which detects an electric arc by means of the voltage drops in the discharge plasma and the electric current and switches off the power supply for a short time, typically from 100 microseconds to 1 millisecond.

Preference is given to one or more of the low-pressure heating chambers provided for nitriding comprising an active grid electrode which is made of an electrically conductive material which is resistant to temperatures up to 1200° C., in particular a metal, a metal alloy, graphite or carbon fiber-reinforced graphite (CFC). The active grid electrode is configured in such a way that in the operating position it largely or completely encloses the charge carrier with the workpieces. In the operating position, the active grid electrode has, for example, the shape of a spherical shell, a hemispherical shell, a partial surface or the entire surface of a cuboid. The active grid electrode preferably has a tunnel like configuration and has a rectangular or semicircular contour with two side grids opposite one another and a covering grid joining the side grids.

In a further embodiment of the apparatus of the invention, the low-pressure heating chambers provided for nitriding are configured for plasma immersion ion implantation. For this purpose, the nitriding heating chambers are connected to an electric pulse generator by means of which negative voltage pulses having an amplitude of from 1 to 300 kV and a variable pulse duration can be applied to the workpieces. In addition, the nitriding heating chambers are connected to a plasma generator. The plasma generator operated at frequencies in the range from 10 to 100 MHz (radiofrequency) or from about 1 to 4 GHz (microwaves). The energy required for generating the plasma is introduced capacitively, inductively or via a waveguide into the gas in the nitriding heating chamber. Various apparatuses for plasma immersion ion implantation are known in the prior art.

Figure 1:
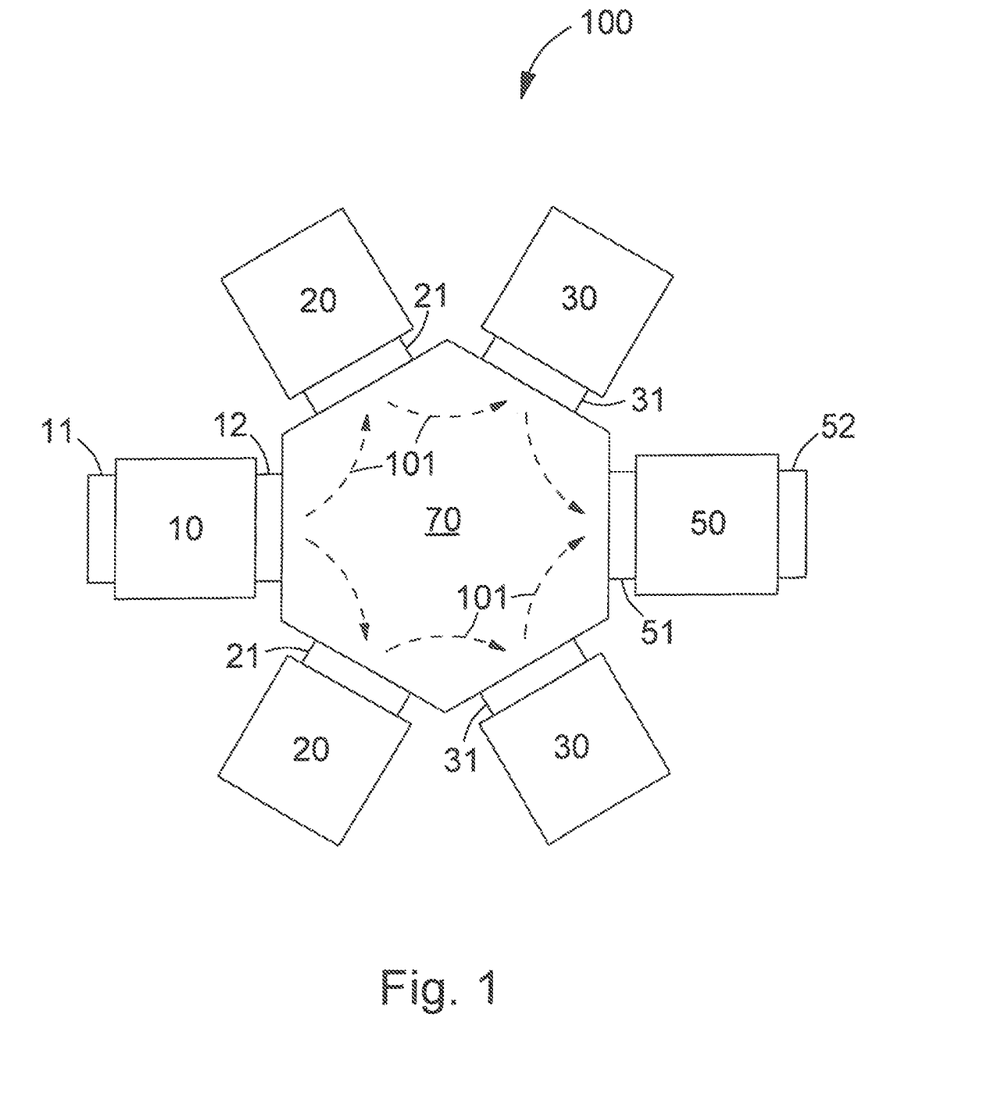
FIG. 1 is a plan view of an exemplary inventive apparatus having a centrally arranged transfer chamber.
Figure 2:
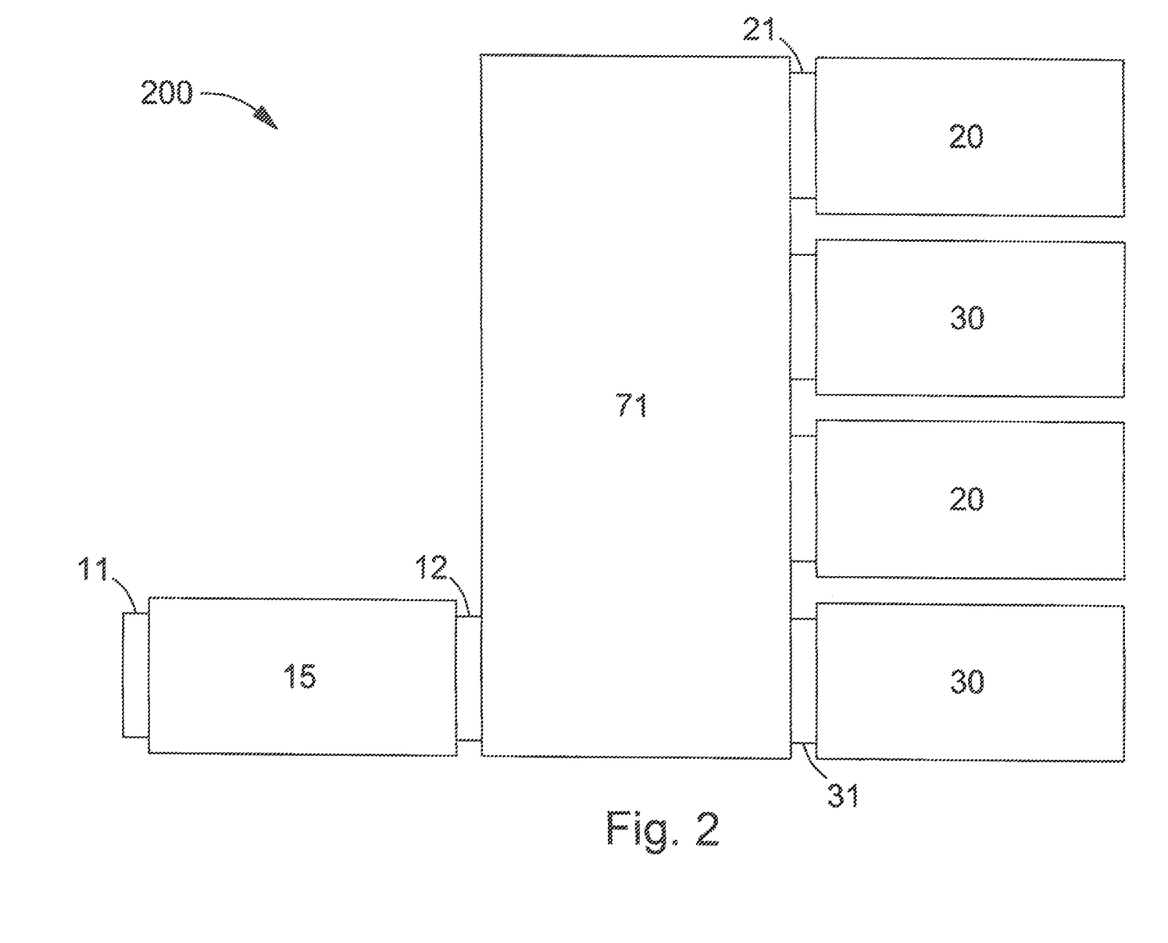
FIG. 2 is a schematic side view of a further exemplary inventive apparatus.
Figure 3:
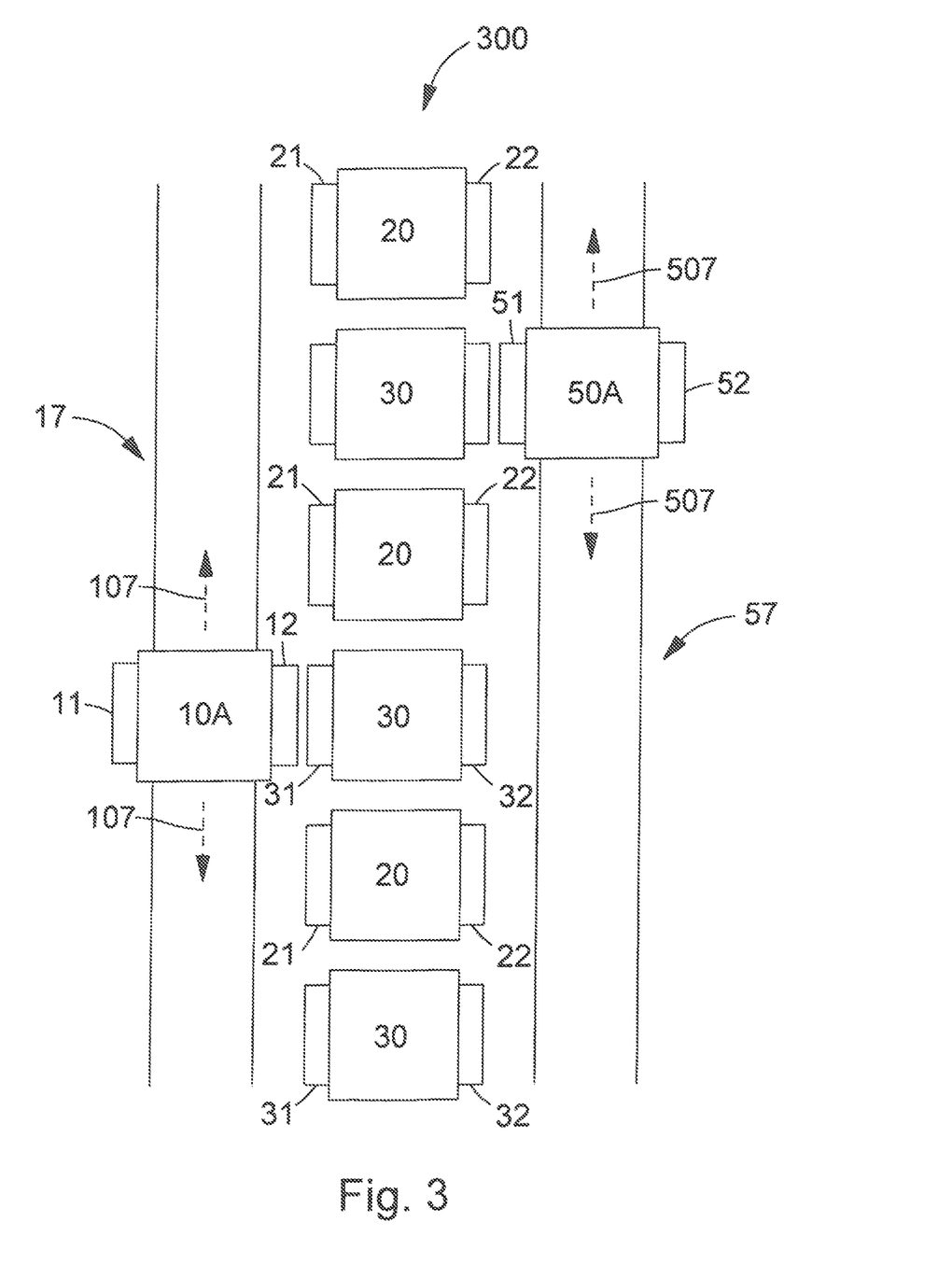
FIG. 3 is a plan view of an additional exemplary apparatus.
Figure 4:
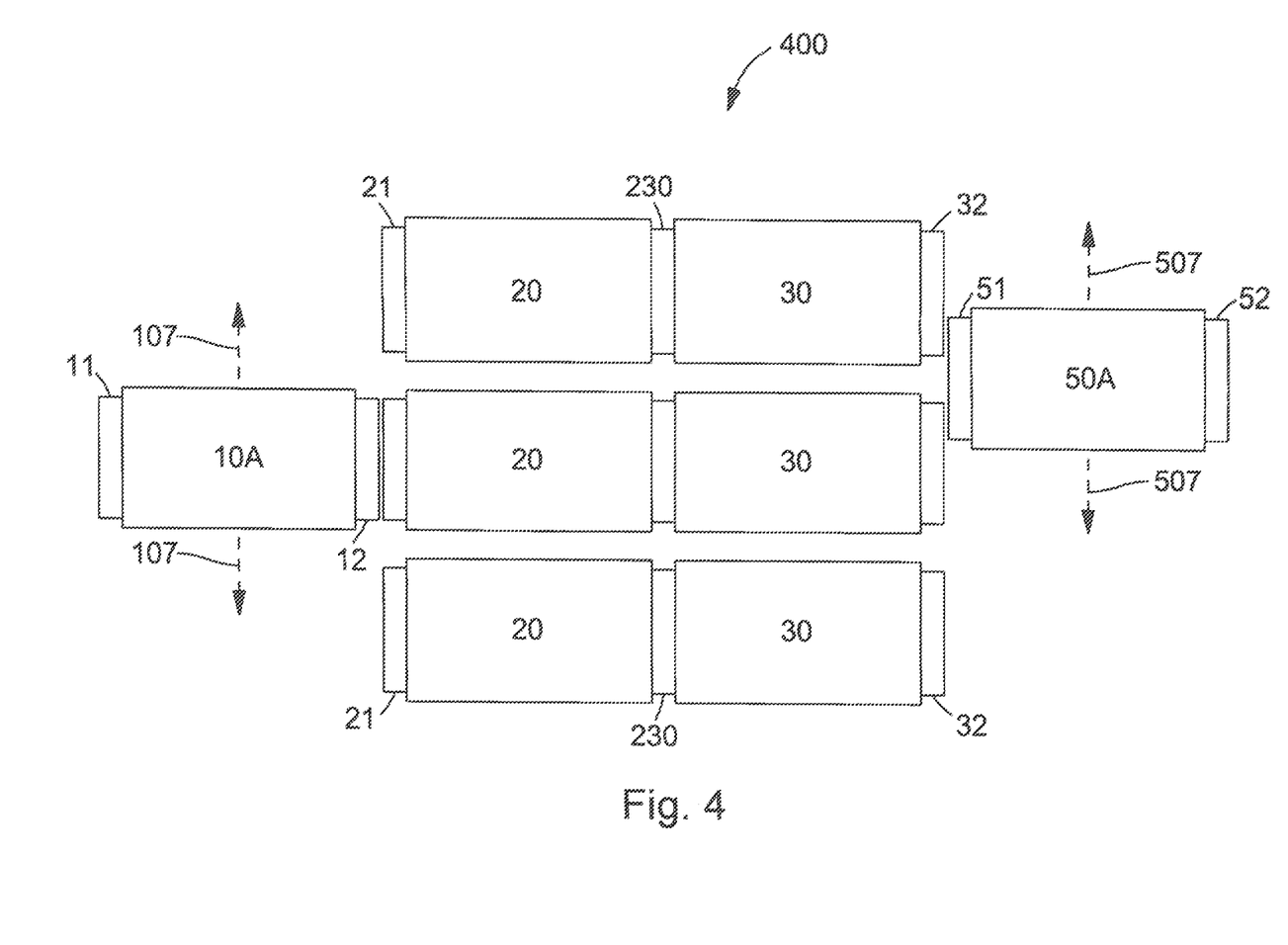
FIG. 4 is a side sectional view of a further exemplary apparatus.
Figure 5:
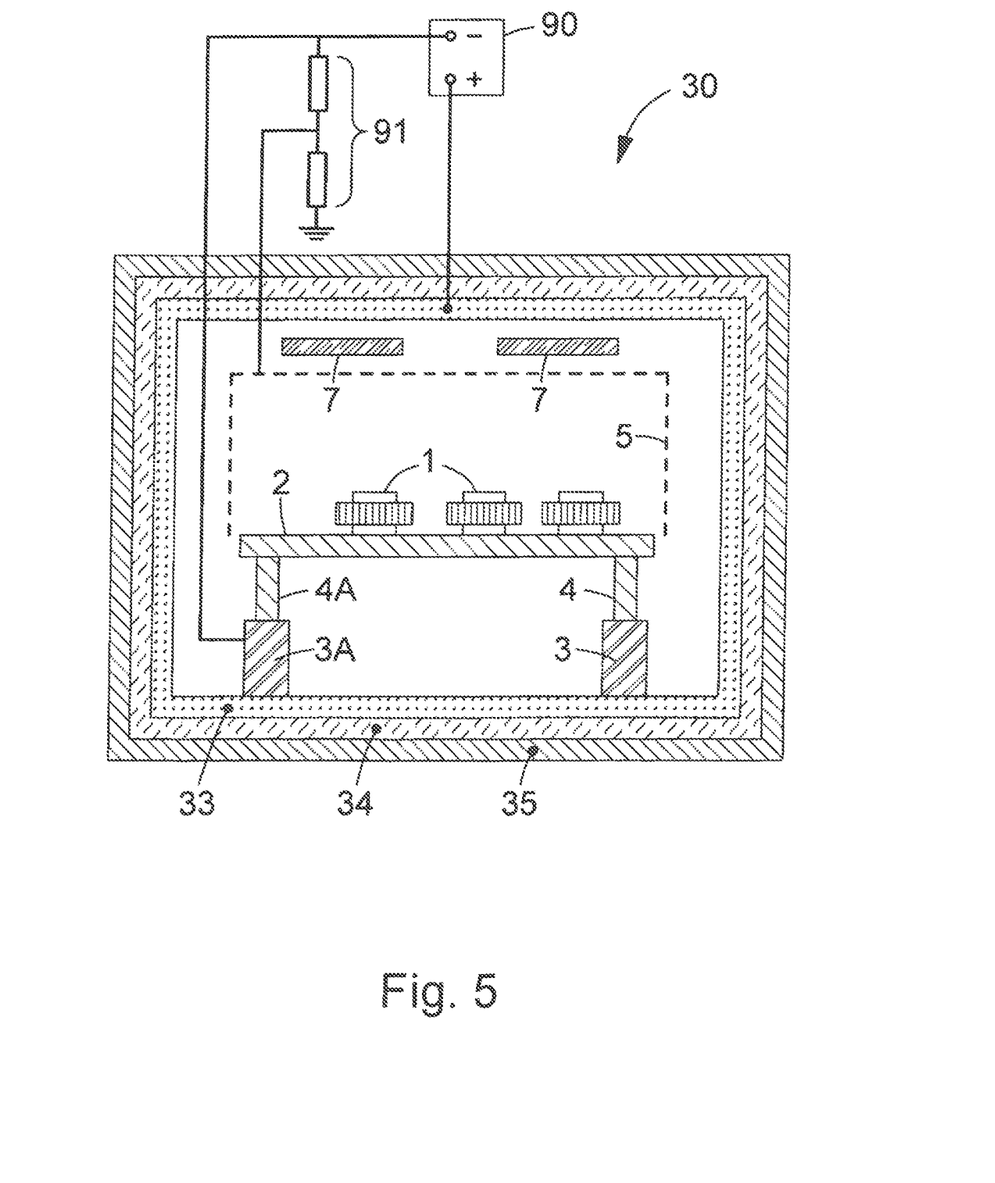
FIG. 5 is a sectional view of an exemplary invenitve low-pressure heating chamber for nitriding.
Figure 6:
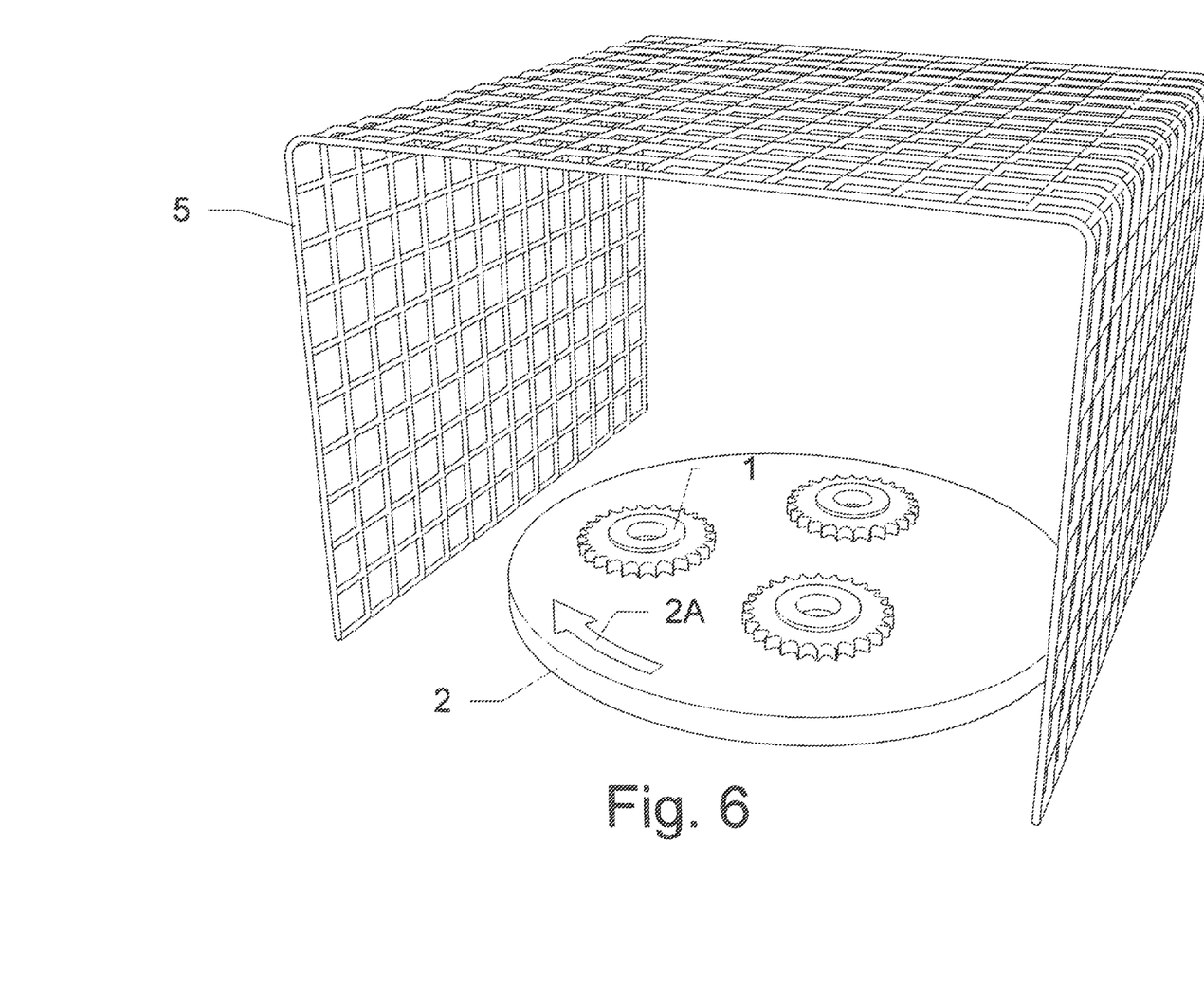
FIG. 6 is a perspective view of an advantageous active grid electrode and charge carrier with workpieces.

The invention is additionally illustrated below with the aid of figures. The figures show:

FIG. 1 an apparatus having a centrally arranged transfer chamber;

FIG. 2 an apparatus having vertically superposed low-pressure heating chambers, a transfer chamber and a stationary bifunctional lock-quenching chamber;

FIG. 3 an apparatus having low-pressure heating chambers arranged horizontally next to one another and in each case a horizontally movable lock and quenching chamber;

FIG. 4 an apparatus having low-pressure heating chambers connected in pairs and in each case a vertically movable lock and quenching chamber;

FIG. 5 a sectional view of a low-pressure heating chamber for nitriding; and FIG. 6 a perspective view of an active grid electrode.

FIG. 1 shows a plan view of a first apparatus 100 according to the invention having a centrally arranged transfer chamber, a lock chamber 10, two low-pressure heating chambers 20 for carburization and optionally diffusion, two low-pressure heating chambers 30 for nitriding and also a quenching chamber 50. Each of the chambers 10, 20, 30 and 50 is rigidly joined to the transfer chamber 70. The interior space of the chambers 10, 20, 30 and 50 can be isolated in a gastight manner from the interior space of the transfer chamber 70 by means of vacuum slide valves or vacuum doors 12, 21, 31 and 51, respectively. On a side opposite the transfer chamber 70, the lock chamber 10 and the quenching chamber 50 are each equipped with a vacuum slide valve or a vacuum door 11 and 52, respectively. With the vacuum slide valve open or vacuum door 11 open and vacuum slide valve closed or vacuum door 12 closed, a charge carrier with workpieces is loaded into the lock chamber 10 without a vacuum in the transfer chamber 70 having a pressure of less than 300 mbar, less than 200 mbar, less than 100 mbar and in particular less than 50 mbar, being adversely affected. After the charge carrier with the workpieces has been loaded into the lock chamber 10, the vacuum slide valve or the vacuum door 11 is closed and the lock chamber 10 is evacuated to a pressure of less than 300 mbar, less than 200 mbar, less than 100 mbar and in particular less than 50 mbar. The vacuum slide valve or the vacuum door 12 is then opened and the charge carrier with the workpieces is transferred by means of a charge transport system into the transfer chamber 70. Subsequently, the charge carrier with the workpieces is loaded from the transfer chamber 70 into one of the low-pressure heating chambers 20 or 30 for carburization or nitriding. The vacuum slide valves or vacuum doors 21 and 31 are preferably open only during loading and unloading of the transfer chamber 70 into the respective low-pressure heating chamber 20 or 30 and vice versa and are otherwise closed in order to minimize contamination and heat losses in/from the low-pressure heating chambers 20, 30 and also thermal stressing of the transfer chamber 70 as a result of heat radiation from the low-pressure heating chambers 20, 30. After one or more carburization and nitriding steps and optionally diffusion steps have in each case been carried out, the charge carrier with the workpieces is transferred, with vacuum slide valve open or vacuum door 51 open, into the quenching chamber 50 which has been evacuated beforehand to a pressure of less than 300 mbar, less than 200 mbar, less than 100 mbar and in particular less than 50 mbar. The vacuum slide valve or the vacuum door 51 is closed and the workpieces are quenched by means of a fluid, for example filtered ambient air which have been compressed to a pressure of up to 20 bar. Furthermore, fluids such as nitrogen, helium or oil which have been compressed to a pressure of u to 20 bar are provided for quenching. To take the charge carrier with the workpieces from the apparatus 100, the vacuum slide valve or the vacuum door 52 is opened with vacuum slide valve closed or vacuum door 51 closed without the vacuum in the transfer chamber 70 being adversely affected.

The material flow or the movement of the charge carrier with the workpieces is indicated by means of movement arrows 101 in FIG. 1.

In an alternative embodiment of the apparatus 100 according to the invention which is not shown in the figures, the chamber 10 is configured as a bifunctional lock-quenching chamber and the chamber 50 is configured as a low-pressure heating chamber for carburization, nitriding or optionally diffusion. In an apparatus configured in this way, the workpieces are loaded and unloaded into/from the apparatus via the lock-quenching chamber.

FIG. 2 shows a schematic side view of a further apparatus 200 according to the invention having in each case two (four in total) vertically superposed low-pressure heating chambers 20 and 30 for carburization and optionally diffusion and respectively for nitriding, which are connected to a transfer chamber 71 and the interior space of which can in each case be isolated in a gastight manner from the interior space of the transfer chamber 71 by means of a vacuum slide valve or a vacuum door 21 or 31, respectively. Furthermore, the apparatus comprises a bifunctional lock-quenching chamber 15 which is likewise connected to the transfer chamber 71 and has two vacuum slide valves or vacuum doors 11 and 12 on opposite end faces. The interior space of the bifunctional lock-quenching chamber 15 can be isolated in a gastight manner from the interior space of the transfer chamber 71 by means of the vacuum slide valve or the vacuum door 12.

In the transfer chamber 71, there is a charge transfer system (not shown in FIG. 2) which comprises a vertically movable elevator on which a telescopic mechanism is mounted. The telescopic mechanism is configured for accommodating and horizontally moving a charger carrier and/or charging rack with workpieces. Charge carriers and/or charging racks with workpieces can be transferred from the bifunctional lock-quenching chamber 15 as desired into one of the low-pressure heating chambers 20, 30 by means of the charge transport system. In addition, depending on the given process charge carriers and/or charging racks with workpieces are transferred from one of the low-pressure heating chambers 20, 30 into another low-pressure heating chamber 20, 30.

In order to load a charge carrier and/or a charging rack with workpieces into the apparatus 200, this is placed in the bifunctional lock-quenching chamber 15 with the vacuum slide valve closed or vacuum door 12 closed and vacuum slide valve open or vacuum door 11 open. The vacuum slide valve or the vacuum door 11 is closed and the interior space of the bifunctional lock-quenching chamber 15 is evacuated by means of pumps. The subsequent process steps of carburization, optionally diffusion and nitriding are carried out in a manner analogous to that described above in connection with the apparatus 100 and FIG. 1. For quenching and unloading a charge carrier and/or a charging rack with workpieces, this is transferred from one of the low-pressure heating chambers 20, 30 into the bifunctional lock-quenching chamber 15.

FIG. 3 shows a plan view of a further apparatus 300 according to the invention having in each case three low-pressure heating chambers 20 and 30 arranged horizontally next to one another for carburization and optionally diffusion or for nitriding, respectively. Each of the low-pressure heating chambers 20 and 30 is equipped with a first vacuum slide valve or a first vacuum door 21 or 31, respectively, on a first and face and with a second vacuum slide valve or a second vacuum door 22 or 32, respectively, a second end face opposite the first. Furthermore, the apparatus 300 comprises a lock chamber 10A which can be moved horizontally along the first end faces of the low-pressure heating chambers 20, 30 and also a quenching chamber 50A which can be moved horizontally along the second end faces of the low-pressure heating chambers 20, 30. For moving the lock chamber 10A and the quenching chamber 50A, linear guides 17 and 57, respectively, which are, for example, configured in the manner of rails, and also drives which are not shown in FIG. 3 are provided.

The movement of the lock chamber 10A and the quenching chamber 50A is indicated by movement arrows 107 and 507, respectively, in FIG. 3. The lock chamber 10A and the quenching chamber 50A are equipped with a first vacuum slide valve or a first vacuum door 11 or 51, respectively, on a first end face and with a second vacuum slide valve or a second vacuum door 12 or 52, respectively, on a second end face opposite the first. With the first vacuum slide valve open or vacuum door 11 open, a charge carrier with workpieces is loaded into the lock chamber 10A. The vacuum slide valves or vacuum doors 11 and 12 are closed and the lock chamber 10A is evacuated to a pressure of less than 300 mbar, less than 200 mbar, less than 100 mbar and in particular less than 50 mbar and, to effect carburization or nitriding, positioned in front of a low-pressure heating chamber 20 which is not occupied by workpieces and docked onto this in a gastight manner. The vacuum slide valve or the vacuum door 12 of the lock chamber 10A and the vacuum slide valve or the vacuum door 21 or 31 of the docked low-pressure heating chamber 20 or 30, respectively, are opened and the charge carrier with the workpieces is transferred by means of a charge transport system from the lock chamber 10A into the docked low-pressure heating chamber 20 or 30, respectively. The vacuum slide valve or the vacuum door 21 or 31, respectively, is closed and the workpieces are subjected in a prescribed order to one or more carburization steps, optionally one or more diffusion steps and one or more nitriding steps. For example, the workpieces are firstly carburized and optionally diffused in a low-pressure heating chamber 20, and subsequently transferred by means of the lock chamber 10A into a low-pressure heating chamber 30 and nitrided therein. After the prescribed carburization, diffusion and nitriding steps have been carried out, the workpieces are quenched by means of a fluid, for example filtered ambient air which has been compressed to a pressure of up to 20 bar, in the quenching chamber 50A. For this purpose, the quenching chamber 50A is positioned in front of the respective low-pressure heating chamber 20 or 30 and docked in a gastight manner onto the latter. The vacuum slide valve or the vacuum door 22 or 32 of the low-pressure heating chamber 20 or 30 and the vacuum slide valve or the vacuum door 51 of the quenching chamber 50A are subsequently opened and the charge carrier with the workpieces is transferred from the low-pressure heating chamber 20 or 30 into the quenching chamber 50A. The vacuum slide valve or the vacuum door 51 is closed and the quenching step is carried out. Finally, the vacuum slide valve or the vacuum door 52 is opened and the charge carrier with the workpieces is taken from the apparatus 300.

In an alternative embodiment of the apparatus 300 according to the invention which is not shown in the figures, the chamber 10A is configured as a bifunctional, movable, lock-quenching chamber, with the quenching chamber 50A being dispensed with. In an apparatus configured in this way, the workpieces are loaded into and unloaded from the apparatus via the lock-quenching chamber.

FIG. 4 shows a sectional view from the side of a further apparatus 400 according to the invention having low-pressure heating chambers 20 and 30 which are arranged horizontally next to one another in pairs and are joined to one another. Two, three, four or more pairs each having a low-pressure heating chamber 20 and a low-pressure heating chamber 30 are vertically superposed. As an alternative, the invention provides for a configuration in which the pairs each having a low-pressure heating chamber 20 and a low-pressure heating chamber 30 are arranged horizontally next to one another. A vacuum slide valve or a vacuum door 230 is arranged between the low-pressure heating chambers 20 and 30 of a pair and separates the interior spaces of the low-pressure heating chambers 20 and 30 from one another and is opened only for the transfer of workpieces. Each of the low-pressure heating chambers 20 is equipped with a vacuum slide valve or a vacuum door 21 on an end face opposite the vacuum slide valve or the vacuum door 230. In an analogous way, each of the low-pressure heating chambers 30 is equipped with a vacuum slide valve or a vacuum door 32 on an end face opposite the vacuum slide valve or the vacuum door 230.

Furthermore, the apparatus 400 comprises a lock chamber 10A which can be moved vertically, or optionally horizontally, and can be positioned in front of each of the low-pressure heating chambers 20 and also a quenching chamber 50A which can be moved vertically, or optionally horizontally, and can be positioned in front of each of the low-pressure heating chambers 30. The lock chamber 10A is equipped with vacuum slide valves or vacuum doors 11 and 12 on two opposite end faces. The quenching chamber 50A is likewise equipped with vacuum slide valves or vacuum doors 51 and 52 on two opposite end faces. The vertical, or optionally horizontal, direction of travel of the lock chamber 10 and the quenching chamber 50A is indicated by movement arrows 107 and 507, respectively. For moving the lock chamber 10A and the quenching chamber 50A, linear guides which are not shown in FIG. 4 and are configured, for example, in the form of rails and also drives are provided.

The apparatus 400 is operated in a manner analogous to that described above in connection with the apparatus 300 and FIG. 3 and differs merely in that the transfer of workpieces from a low-pressure heating chamber 20 into a low-pressure heating chamber 30 is carried out directly without a movable lock chamber 20 being required for this purpose.

FIG. 5 shows a schematic sectional view of a low-pressure heating chamber 30 which is provided for nitriding and has an inner chamber wall 33, an outer chamber wall 35 and thermal insulation arranged between the inner and outer chamber walls 33 and 35 and also one or more heating elements 7. The outer chamber wall 35 is preferably made of a metallic material, in particular steel, and optionally equipped with water cooling (not shown in FIG. 5). The thermal insulation 34 preferably consists of graphite felt. The inner chamber wall 33 and the heating elements 7 are preferably made of graphite or carbon fiber-reinforced graphite (CFC). The low-pressure heating chamber 30 is preferably equipped with supports 3, 3A for a charge carrier, where at least one support 3A has an electric contact or is made of an electrically conductive material such as a metal, a metal alloy, graphite or carbon fiber-reinforced graphite (CFC).

Furthermore, a charge carrier 2 with workpieces 1 to be treated and an optional active grid electrode 5 are shown in FIG. 5. The charge carrier 2 is preferably configured in the form of a plate or grid and provided on an underside with positioning feet 4, 4A, where at least one of the positioning feet 4A is electrically conductive.

The supports 3, 3A and the positioning feet 4, 4A are arranged so as to fit one another, so that electrically conductive contact is established between the support 3A and the positioning foot 4A.

The inner chamber wall 33 is connected via electric cables to the plus pole of an electric energy supply 90. The electric energy supply 90 is preferably designed as a pulsable DC voltage source and is configured for operation of a discharge plasma at a DC voltage of from 200 to 1000 V, a direct current of from 10 to 200 A and a continuous power of from 2 to 200 kVA. In a particularly advantageous embodiment of the invention, the electric energy supply 90 comprises an ignition impulse generator.

The electric cables used for the low-pressure heating chambers are sometimes made of a heat-resistant material such as tungsten or graphite. As an alternative, copper cables having thermal shielding composed of a ceramic material are used.

The charge carrier 2 or the support 3A and/or an optional active grid electrode 5 are connected is electric cables to the minus pole of the electric energy supply 90 and connected as cathode relative to the inner chamber wall 33.

When an active grid electrode 5 is used, it can be advantageous to apply a negative potential (known as bias voltage) to the workpieces 1 relative to the active grid electrode 5. Accordingly, an optional voltage divider 91 with two outlets or clips for the workpieces 1 and the active grid 5 is provided.

FIG. 6 shows a perspective view of an advantageously configured active grid electrode 5 and also a charge carrier 2 with workpieces 1. The active grid electrode 5 has a tunnel-like configuration with two side parts opposite one another and a covering part connecting the two side parts.

The charge carrier 2 is optionally coupled to a rotary drive which is not shown in FIG. 6. The rotary drive makes it possible to turn the charge carrier 2 continuously during nitriding in order to ensure very homogeneous treatment of the workpieces 1 with the discharge plasma. The rotation of the charge carrier 2 is indicated by the movement arrow 2A in FIG. 6.

LIST OF REFERENCE NUMERALS

1 Workpieces
2 Charge carrier
2A Movement arrow
3, 3A Support for charge carrier
4, 4A Positioning feet of the charge carrier
5 Active grid electrode
10 Stationary lock chamber
10A Movable lock chamber
15 Lock-quenching chamber
17 Movement device
20 Low-pressure heating chamber for carburization
30 Low-pressure heating chamber for nitriding
33 Inner wall of a low-pressure heating chamber
34 Thermal insulation of a low-pressure heating chamber
35 Outer wall of a low-pressure heating chamber
50 Stationary quenching chamber
50A Movable quenching chamber
57 Movement device
70 Transfer chamber (horizontal)
71 Transfer chamber (vertical)
90 Electric energy supply
11, 12, 21, 22, 31, 32, 51, 52, 230 Vacuum slide valves or vacuum doors
90 Electric energy supply
100 Apparatus for thermochemical hardening
200 Apparatus for thermochemical hardening
300 Apparatus for thermochemical hardening
400 Apparatus for thermochemical hardening
101 Movement arrows
107 Movement arrows
507 Movement arrows

The invention claimed is:

1. A process for the thermochemical hardening of workpieces comprising, in a variable order:
one or more carburizing steps, in each case in a carbon-containing gas atmosphere having a pressure of less than 50 mbar, where the workpieces are maintained at temperatures of from 900 to 1050° C.;
optionally one or more diffusing steps, in each case in a gas atmosphere having a pressure of less than 100 mbar; and
one or more nitriding steps within low pressure heating chamber(s), in each case in a nitrogen-containing gas atmosphere having a pressure of less than 50 mbar, where the workpieces are maintained at temperatures of from 800 to 1050° C., the nitrogen-containing gas atmosphere contains molecular nitrogen ($N_2$) as donor gas and is excited by a discharge plasma in the low pressure heating chamber(s); wherein
the process is carried out in such a way that time intervals between two successive process steps are shorter than 15 minutes and the workpieces are maintained in a gas atmosphere having a pressure of less than 300 mbar during these time intervals.

2. The process as claimed in claim 1, wherein the time intervals between two successive process steps are shorter than 10 minutes.

3. The process as claimed in claim 2, wherein the time intervals between two successive process steps are shorter than 5 minutes.

4. The process as claimed in claim 2, wherein the time intervals between two successive process steps are shorter than 1 minute.

5. The process as claimed in claim 1, wherein the workpieces are maintained in a gas atmosphere having a pressure of less than 200 mbar during a time interval between two successive process steps.

6. The process as claimed in claim 5, wherein the workpieces are maintained in a gas atmosphere having a pressure of less than 100 mbar.

7. The process as claimed in claim 1, wherein the temperature of the workpieces is greater than 600° C. during a time interval between two successive process steps.

8. The process as claimed in claim 7, wherein the temperature of the workpieces is greater than 700° C.

9. The process as claimed in claim 7, wherein the temperature of the workpieces is greater than 800° C.

10. The process as claimed in claim 7, wherein the discharge plasma is generated using an active grid electrode having a rectangular or semicircular contour tunnel-like configuration with two side parts opposite one another and a covering part connecting the two side parts.

11. The process as claimed in claim 1, wherein the process comprises, in sequential order, the steps
carburizing/nitriding;
carburizing/diffusing/nitriding;
nitriding/carburizing/nitriding;
nitriding/carburizing/nitriding/carburizing; or
nitriding/carburizing/diffusing/nitriding.

12. The process as claimed in claim 1, wherein the process further comprises operating the discharge plasma at DC voltage of from 200 to 1000 V, a direct current of from 10 to 200 A and a continuous power of from 2 to 200 kVA, and the DC voltage is optionally pulsed.

13. The process as claimed in claim 1, wherein the process further comprises exciting an atmosphere consisting of the nitrogen-containing gas atmosphere by means of a pulsed direct current discharge plasma in one or more of the nitriding steps.

14. The process as claimed in claim 13, wherein the nitrogen-containing gas atmosphere is excited by pulsed direct current discharge plasma in combination with ignition impulses in one or more of the nitriding steps.

15. The process as claimed in claim 1, wherein the discharge plasma is generated using an active grid electrode in one or more of the nitriding steps.

16. The process as claimed in claim 15, wherein the workpieces are maintained at a negative electric potential relative to the active grid electrode having an absolute value of from 10 to 400 volt.

17. The process as claimed in claim 16, wherein the workpieces are maintained at a negative electric potential relative to the active grid electrode having an absolute value of from 10 to 200 V.

18. The process as claimed in claim 1, wherein plasma immersion ion implantation is used in one or more of the nitriding steps.

19. The process as claimed in claim 1, wherein the workpieces are maintained at temperatures of from 820 to 1000° C. during the nitriding steps.

20. The process as claimed in claim 19, wherein the workpieces are maintained at temperatures of from 920 to 980° C. during the nitriding steps.

21. The process as claimed in claim 1, wherein the workpieces are maintained at temperatures of from 940 to 1050° C. during the carburization steps.

22. The process as claimed in claim 1, wherein the nitrogen-containing gas atmosphere in the nitriding steps consists of $N_2$ and optionally one or more carrier gases.

23. The process as claimed in claim 22, wherein the carrier gases are selected from $H_2$ and argon.

24. The process as claimed in claim 1, wherein the nitrogen-containing gas atmosphere in the nitriding steps consists of $N_2$ and one or more carbon-containing gases and optionally one or more carrier gases.

25. The process as claimed in one or more of claim 24, wherein the carbon-containing gases are $CO_2$ or $CH_4$ and the carrier gases are selected from $H_2$ and argon.

26. The process as claimed in claim 24, wherein the proportion of carbon-containing gases, based on $N_2$, is from 2 to 20% by volume.

27. The process as claimed in claim 26, wherein the proportion of carbon-containing gases, based on $N_2$, is from 4 to 15% by volume.

28. The process as claimed in claim 26, wherein the proportion of carbon-containing gases, based on $N_2$, is from 4 to 10% by volume.

29. The process as claimed in claim 1, wherein the pressure of the nitrogen-containing gas atmosphere in the nitriding steps is less than 40 mbar.

30. The process as claimed in claim 29, wherein the pressure of the nitrogen-containing gas atmosphere in the nitriding steps is less than 30 mbar.

31. The process as claimed in claim 29, wherein the pressure of the nitrogen-containing gas atmosphere in the nitriding steps is less than 20 mbar.

32. The process as claimed in claim 1, wherein the carbon-containing gas atmosphere in the carburization steps consists of one or more carbon-containing donor gases and optionally one or more carrier gases.

33. The process as claimed in claim 32, wherein the carbon-containing donor gases are selected from $C_2H_2$, $CO_2$ and $CH_4$ and the carrier gases are selected from $H_2$ and argon.

34. The process as claimed in claim 1, wherein the pressure of the carbon-containing gas atmosphere in the carburization steps is less than 40 mbar.

35. The process as claimed in claim 34, wherein the pressure of the carbon-containing gas atmosphere in the carburization steps is less than 30 mbar.

36. The process as claimed in claim 34, wherein the pressure of the carbon-containing gas atmosphere in the carburization steps is less than 20 mbar.

37. The process as claimed in claim 1, wherein the process comprises a high-pressure diffusing step in an $N_2$ atmosphere having a pressure of from 0.9 to 2 bar.

38. The process as claimed in claim 37, wherein the process comprises, in sequential order, the steps
nitriding/carburizing/high-pressure diffusing.

39. The process as claimed in claim 1, wherein said process further comprises turning the workpieces continuously in the discharge plasma during nitriding.

* * * * *